US012720960B2

(12) United States Patent
Cheng et al.

(10) Patent No.: US 12,720,960 B2
(45) Date of Patent: Aug. 25, 2026

(54) DISPLAY SUBSTRATE, DISPLAY PANEL, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Bo Cheng, Beijing (CN); Mengmeng Du, Beijing (CN); Jie Gou, Beijing (CN); Hongwei Ma, Beijing (CN); Yixiang Yang, Beijing (CN); Shuangbin Yang, Beijing (CN); Jun Yan, Beijing (CN); Yujing Li, Beijing (CN); Zhenhua Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 684 days.

(21) Appl. No.: 17/922,471

(22) PCT Filed: Jun. 8, 2021

(86) PCT No.: PCT/CN2021/098824
§ 371 (c)(1),
(2) Date: Oct. 31, 2022

(87) PCT Pub. No.: WO2022/022072
PCT Pub. Date: Feb. 3, 2022

(65) Prior Publication Data

US 2023/0180528 A1 Jun. 8, 2023

(30) Foreign Application Priority Data

Jul. 27, 2020 (CN) ......................... 202010730128.9

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/353* (2023.02);
(Continued)

(58) Field of Classification Search
None
See application file for complete search history.

(56) References Cited

U.S. PATENT DOCUMENTS 11,563,196 B2 * 1/2023 Yan ..................... H10K 59/124
2017/0077447 A1 3/2017 Kang et al.
(Continued)

FOREIGN PATENT DOCUMENTS

CN 107340683 A 11/2017
CN 109119437 A 1/2019
(Continued)

OTHER PUBLICATIONS

CN202010730128.9 first office action.
PCT/CN2021/098824 international search report.

*Primary Examiner* — Nishath Yasmeen
(74) *Attorney, Agent, or Firm* — IPro, PLLC

(57) ABSTRACT

A display substrate, a display panel, and a display apparatus. The display substrate includes: a base substrate, the base substrate comprising bending regions; a plurality of sub-pixels located on the base substrate; and a pixel defining layer, wherein the pixel defining layer is provided with a plurality of first openings in the bending regions, the orthographic projections of the sub-pixels in the bending regions are located in the orthographic projections of the first openings, the angle of gradient of the first openings is
(Continued)

greater than a preset angle, and the angle of gradient of the first openings has a positive correlation with the curvature of the bending regions, such that emergent light of the sub-pixels in the bending regions is not blocked by the pixel defining layer.

8 Claims, 15 Drawing Sheets

(51) Int. Cl.
*H10K 59/35* (2023.01)
*H10K 71/00* (2023.01)
*H10K 77/10* (2023.01)
*H10K 102/00* (2023.01)

(52) U.S. Cl.
CPC .......... *H10K 71/00* (2023.02); *H10K 77/111* (2023.02); *H10K 2102/351* (2023.02)

(56) References Cited

U.S. PATENT DOCUMENTS

| | | | | |
|---|---|---|---|---|
| 2019/0035866 | A1 | 1/2019 | Mo et al. | |
| 2020/0168670 | A1* | 5/2020 | Kim .................. | H10K 59/1213 |
| 2021/0167145 | A1 | 6/2021 | Gong et al. | |
| 2021/0408467 | A1* | 12/2021 | Yan ..................... | H10K 59/124 |

FOREIGN PATENT DOCUMENTS

| | | | | | |
|---|---|---|---|---|---|
| CN | 110992830 | A | | 4/2020 | |
| CN | 111446276 | A | | 7/2020 | |
| CN | 111446277 | A | | 7/2020 | |
| CN | 111768712 | A | | 10/2020 | |
| CN | 110992830 | B | * | 9/2021 | ............ G09F 9/301 |
| EP | 2451251 | A1 | | 5/2012 | |
| IN | 109136834 | A | | 1/2019 | |

* cited by examiner

103' H 103' K1 103' H 103'
101

DISPLAY SUBSTRATE, DISPLAY PANEL, AND DISPLAY APPARATUS

CROSS REFERENCE TO RELATED APPLICATIONS

The present application is a National Stage of International Application No. PCT/CN2021/098824, filed on Jun. 8, 2021, which claims priority to the Chinese Patent Application No. 202010730128.9, filed to the China Patent Office on Jul. 27, 2020 and entitled "DISPLAY SUBSTRATE, DISPLAY PANEL, AND DISPLAY APPARATUS", the entire contents of which are incorporated herein by reference.

FIELD

The present disclosure relates to the technical field of display, in particular to a display substrate, a display panel, and a display apparatus.

BACKGROUND

With development of a flexible active matrix/organic light emitting diode (AMOLED) display technology, people not only have higher demands for a definition, a color gamut and other image qualities, but also have a higher pursuit for a product appearance, such as a large-angle bent curved screen, and a future rollable screen.

SUMMARY

In one aspect, an embodiment of the present disclosure provides a display substrate, including:

- a base substrate, including a bending region;
- a plurality of sub-pixels, located on the base substrate; and
- a pixel defining layer, having a plurality of first openings in the bending region, wherein orthographic projections of the sub-pixels in the bending region are located in orthographic projections of the first openings, a taper angle of the first openings is greater than a preset angle, and the taper angle of the first openings is in positive correlation with a curvature of the bending region, such that emergent light of the sub-pixels in the bending region is not blocked by the pixel defining layer.

Optionally, in the above display substrate provided by the embodiment of the present disclosure, in the bending region, a side surface of the pixel defining layer includes: a first part, a transition part and a second part arranged continuously in sequence in a direction away from the base substrate, wherein

- in a direction perpendicular to the base substrate, a thickness of the first part is greater than a thickness of the transition part and smaller than a thickness of the second part.

Optionally, in the above display substrate provided by the embodiment of the present disclosure, in the bending region, a side surface of the pixel defining layer includes: a first part, and a transition part and a second part which are arranged alternately at a boundary of a side of the first part close to the base substrate, wherein

- in a direction perpendicular to the base substrate, a thickness of the second part is greater than a thickness of the transition part and smaller than a thickness of the first part.

Optionally, in the above display substrate provided by the embodiment of the present disclosure, the taper angle of the first openings is greater than or equal to 160° and smaller than or equal to 170°.

Optionally, in the above display substrate provided by the embodiment of the present disclosure, the base substrate further includes a flat region, the pixel defining layer has a plurality of second openings in the flat region, orthographic projections of the sub-pixels in the flat region are located in orthographic projections of the second openings, and a shape of the second openings is same as a shape of the first openings.

Optionally, in the above display substrate provided by the embodiment of the present disclosure, the base substrate further includes a flat region, the pixel defining layer has a plurality of second openings in the flat region, orthographic projections of the sub-pixels in the flat region are located in orthographic projections of the second openings, and a taper angle of the second openings is smaller than the taper angle of the first openings.

Optionally, in the above display substrate provided by the embodiment of the present disclosure, the taper angle of the second openings is greater than or equal to 140° and smaller than or equal to 150°.

Optionally, in the above display substrate provided by the embodiment of the present disclosure, in the flat region, a side surface of the pixel defining layer is a plane, and an included angle between the plane and a side surface of the pixel defining layer close to the base substrate is greater than or equal to 30° and smaller than or equal to 40°.

In another aspect, an embodiment of the present disclosure provides a manufacturing method for a display substrate, including:

- providing a base substrate;
- forming a pixel defining layer on the base substrate, wherein the pixel defining layer has a plurality of first openings whose angle of gradient is greater than a preset angle in a to-be-bent region;
- forming a plurality of sub-pixels in the plurality of first openings of the pixel defining layer; and
- bending the base substrate having the plurality of sub-pixels, wherein a curvature of a bending region is in positive correlation with a taper angle of the first openings, such that emergent light of the sub-pixels of the bending region is not blocked by the pixel defining layer.

Optionally, in the above manufacturing method provided by the embodiment of the present disclosure, the forming a pixel defining layer includes:

- forming a photosensitive material layer on the base substrate;
- providing a first mask, wherein the first mask includes a first transparent substrate and a first light shield layer located on the first transparent substrate, and the first light shield layer has a plurality of first light transmitting regions, a plurality of second light transmitting regions surrounding the first light transmitting regions, and a light shield region located between the first light transmitting regions as well as between the first light transmitting regions and the second light transmitting regions;
- performing an exposure and developing on the photosensitive material layer in sequence by adopting the first mask, and forming, in the photosensitive material layer, a plurality of first openings located in a to-be-bent region, a plurality of second openings located in a flat region, and a plurality of annular grooves surrounding the first openings and the second openings; and baking the photosensitive material layer, and forming a pixel defining layer with a taper angle being 10°-20° in the to-be-bent region and the flat region.

Optionally, in the above manufacturing method provided by the embodiment of the present disclosure, the forming a pixel defining layer includes:

forming a photosensitive material layer on the base substrate;

providing a second mask, wherein the second mask includes a second transparent substrate, and a second light shield layer located on the second transparent substrate, the second light shield layer corresponding to a to-be-bent region and a flat region has a plurality of first light transmitting regions, and a light shield region located between all the first light transmitting regions, and the light shield region in the to-be-bent region further internally has a plurality of second light transmitting regions surrounding the first light transmitting regions;

performing an exposure and developing on the photosensitive material layer in sequence by adopting the second mask, and forming, in the photosensitive material layer, a plurality of first openings located in the to-be-bent region, a plurality of second openings located in the flat region, and annular grooves surrounding the first openings; and baking the photosensitive material layer, and forming a pixel defining layer with a taper angle being 10°-20° in the to-be-bent region and a taper angle being 30°-40° in the flat region.

Optionally, in the above manufacturing method provided by the embodiment of the present disclosure, a width of each of the annular grooves is 0.5 nm to 5 μm.

Optionally, in the above manufacturing method provided by the embodiment of the present disclosure, a width of the photosensitive material layer between the annular grooves and pixel openings is 0.5 nm to 5 μm.

Optionally, in the above manufacturing method provided by the embodiment of the present disclosure, the pixel defining layer has a first angle of gradient in the flat region, and the forming a pixel defining layer includes:

forming a photosensitive material layer on the base substrate;

providing a third mask, wherein the third mask includes a third light shield layer, and the third light shield layer has a plurality of light transmitting regions and a light shield region which is located between all the light transmitting regions and has a sawtooth structure at an edge;

performing an exposure and developing on the photosensitive material layer in sequence by adopting the third mask, and forming, in the photosensitive material layer, a plurality of first openings located in a to-be-bent region and a plurality of second openings located in a flat region, wherein the photosensitive material layer around the plurality of first openings and the plurality of second openings has a sawtooth structure; and baking the photosensitive material layer, and forming a pixel defining layer with a taper angle being 10°-20° in the to-be-bent region and the flat region.

Optionally, in the above manufacturing method provided by the embodiment of the present disclosure, the forming a pixel defining layer includes:

forming a photosensitive material layer on the base substrate;

providing a fourth mask, wherein the fourth mask includes a fourth light shield layer, the fourth light shield layer corresponding to the to-be-bent region and the flat region has a plurality of light transmitting regions, and a light shield region located between all the light transmitting regions, and an edge of the light shield region corresponding to the to-be-bent region has a sawtooth structure;

performing an exposure and developing on the photosensitive material layer in sequence by adopting the fourth mask, and forming, in the photosensitive material layer, a plurality of first openings located in the to-be-bent region and a plurality of second openings located in the flat region, wherein the photosensitive material layer around the plurality of first openings has a sawtooth structure; and baking on the photosensitive material layer, and forming a pixel defining layer with a taper angle being 10°-20° in the to-be-bent region and a taper angle being 30°-40° in the flat region.

In another aspect, an embodiment of the present disclosure provides a display panel, including the above display substrate provided by the embodiment of the present disclosure.

In another aspect, an embodiment of the present disclosure provides a display apparatus, including the above display panel provided by the embodiment of the present disclosure.

DETAILED DESCRIPTION OF THE EMBODIMENTS

Figure 1:
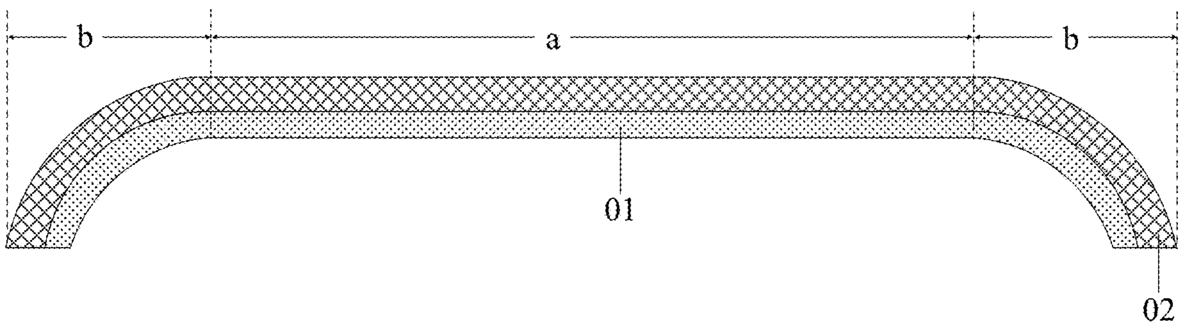
FIG. 1 is a schematic structural diagram of a display panel provided by an embodiment of the present disclosure.

In order to make objectives, technical solutions and advantages of embodiments of the present disclosure clearer, the technical solutions of the embodiments of the present disclosure will be described clearly and completely below with reference to the accompanying drawings of the embodiments of the present disclosure. It needs to be noted that a size and a shape of each figure in the accompanying drawings do not reflect a true scale and only intend to illustrate contents of the present disclosure. The same or similar reference numbers represent the same or similar components or components with the same or similar functions all the time. Apparently, the described embodiments are some, but not all, of the embodiments of the present disclosure. All other embodiments obtained by those ordinarily skilled in the art without creative work on the basis of the described embodiments of the present disclosure fall within the protection scope of the present disclosure.

Unless otherwise defined, technical or scientific terms used herein should be commonly understood by those ordinarily skilled in the art of the present disclosure. “First”, “second” and other similar words used in the specification and the claims of the present disclosure do not denote any sequence, quantity or significance and are only used for distinguishing different components. “Include” or “contain” or other similar words means that a component or an item preceding the word covers components or items and their equivalents listed after the word without excluding other components or items. “Inner”, “outer”, “upper”, “lower” and the like are only used for denoting a relative position relation, and when an absolute position of a described object changes, the relative position relation may also change correspondingly.

A curved screen bent at a large angle (such as 90°) and a future rollable screen both need large-angle bending of a flexible screen. Taking a large-angle bent curved screen shown in FIG. 1 as an example, in the related art, an edge of the curved screen is a bending region b and a middle of the curved screen is a flat region a, when the curved screen is bright, the screen is usually watched in front of a center of the screen, taking a white image as an example, it can be seen that the flat region a emits white light and the bending region b emits yellow light, and consequently, display quality of the bending region b is not as good as that of the flat region a. Specifically, in the flat region a of the curved screen, a pixel defining layer does not block emergent light of sub-pixels, so emergent light of sub-pixels in different colors is mixed to form white light; in the bending region b, bending causes the pixel defining layer to deform and block part of emergent light of the sub-pixels, in the related art, a material of the pixel defining layer may generate yellow light after absorbing blue light, red light and green light emitted by the sub-pixels are mixed to form yellow light, and based on this, a problem of yellowing of the bending region b occurs (edge color shift).

Figure 2:
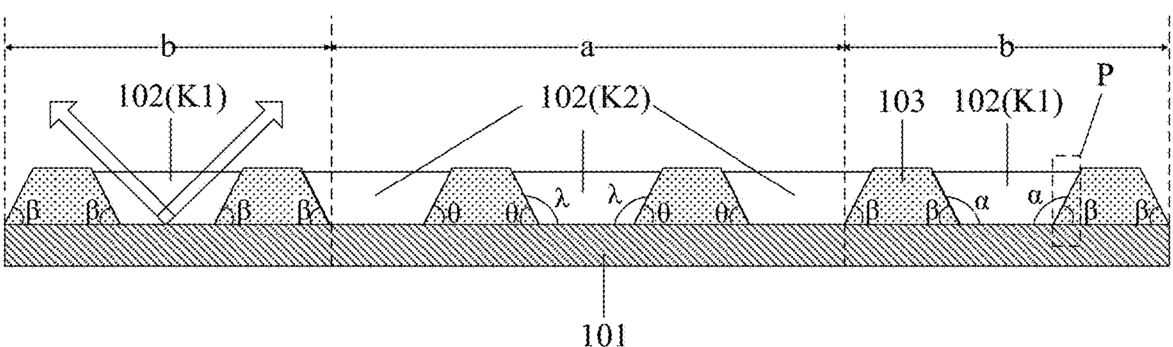
FIG. 2 is a schematic structural diagram of a display substrate provided by an embodiment of the present disclosure.

Specific to the above technical problem in the related art, an embodiment of the present disclosure provides a display substrate, as shown in FIG. 2, including:

- a base substrate 101, including a bending region b;
- a plurality of sub-pixels 102, located on the base substrate 101;
- a pixel defining layer 103, having a plurality of first openings K1 in the bending region b, wherein orthographic projections of the sub-pixels 102 in the bending region b are located in orthographic projections of the first openings K1, a taper angle $\alpha$ of the first openings K1 (correspondingly, a first angle of gradient $\beta$ of the pixel defining layer 103 around the first openings K1 is a supplementary angle of $\alpha$) is greater than a preset angle, and the taper angle $\alpha$ of the first openings K1 is in positive correlation with a curvature of the bending region b, such that emergent light of the sub-pixels 102 in the bending region b is not blocked by the pixel defining layer 103.

In the above display substrate provided by the embodiment of the present disclosure, the taper angle $\alpha$ of the first openings K1 in the bending region b is set to be greater than the preset angle (for example, a taper angle of a pixel opening in the related art) and be in positive correlation with the curvature of the bending region b, such that the emergent light of the sub-pixels 102 in the bending region b is not blocked by the pixel defining layer 103, thus blue light emitted by the sub-pixels 102 is prevented from turning into yellow light due to being blocked and absorbed by the pixel defining layer 103, it is guaranteed that blue light, green light and red light emitted by the sub-pixels 102 are mixed to form white light, and thus the problem of yellowing of the bending region b is effectively solved (improving edge color shift).

Figure 3:
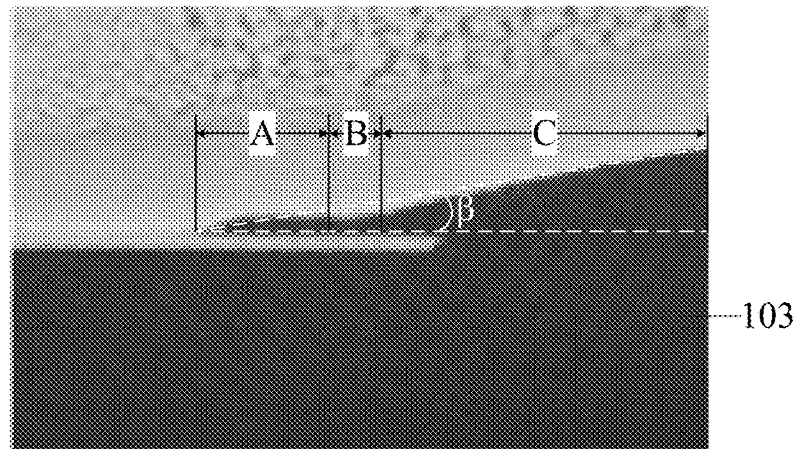
FIG. 3 is a micrograph of a region P in FIG. 2.

Optionally, in the above display substrate provided by the embodiment of the present disclosure, as shown in FIG. 3, in the bending region b, a side surface of the pixel defining layer 103 includes: a first part A, a transition part B and a second part C arranged continuously in sequence in a direction away from the base substrate 101.

In a direction perpendicular to the base substrate 101, a thickness of the first part A is greater than a thickness of the transition part B and smaller than a thickness of the second part C.

In a process of forming the pixel defining layer 103 by using a photosensitive material, annular grooves may be formed in the photosensitive material among the first openings K1, the photosensitive material close to the annular grooves may flow into the annular grooves due to fluidity of the photosensitive material, finally, after baking and setting, the transition part B with a smaller thickness as well as the first part A and the second part C located on two sides of the transition part B respectively are formed, and compared with a technical solution of no annular groove in the related art, in the present disclosure, a whole thickness of the pixel defining layer 103 in the bending region b is smaller, and the first angle of gradient $\beta$ is reduced.

Optionally, in the above display substrate provided by the embodiment of the present disclosure, in the bending region b, a side surface of the pixel defining layer 103 includes: a first part A, and a transition part B and a second part C which are arranged alternately at a boundary of a side of the first part A close to the base substrate 101.

In a direction perpendicular to the base substrate 101, a thickness of the second part C is greater than a thickness of the transition part B and smaller than a thickness of the first part A.

In a process of forming the pixel defining layer 103 by using a photosensitive material, a sawtooth structure may be arranged in a photosensitive material close to the first openings K1, the photosensitive material around the sawtooth structure may fill a gap among the sawtooth structure due to fluidity of the photosensitive material, finally, after baking and setting, the transition part B with a smaller thickness, the second part C (corresponding to a position of the sawtooth structure) arranged alternately with the transition part B, and the first part A located in a position of the transition part B and the second part C away from the first openings K1 are formed, and compared with a technical solution of no sawtooth structure in the related art, in the present disclosure, a whole thickness of the pixel defining layer 103 in the bending region b is smaller, and the first angle of gradient β is reduced.

Optionally, in the above display substrate provided by the embodiment of the present disclosure, in order to effectively solve a phenomenon of yellowing of the bending region b, the taper angle α of the first openings K1 is greater than or equal to 160° and smaller than or equal to 170°. Correspondingly, the first angle of gradient β of the pixel defining layer 103 in the bending region b is greater than or equal to 10° and smaller than or equal to 20°, for example, 10°, 11°, 12°, 13°, 14°, 15°, 16°, 17°, 18°, 19°, 20° and the like.

Optionally, in the above display substrate provided by the embodiment of the present disclosure, as shown in FIG. 2, the base substrate 101 further includes a flat region a, the pixel defining layer 103 has a plurality of second openings K2 in the flat region a, and orthographic projections of the sub-pixels 102 in the flat region a are located in orthographic projections of the second openings K2. In the related art, the pixel defining layer 103 in the flat region a cannot block emergent light of the sub-pixels, so the second openings K2 in the flat region a may keep the same shape as in the related art (specifically, a taper angle λ of the second openings K2 is greater than or equal to 150° and smaller than or equal to 140°), and correspondingly, a second angle of gradient θ of the pixel defining layer 103 may keep 30° to 40° invariably as in the related art. Certainly, the second openings K2 in the flat region a may keep the same shape as the shape of the first openings K1 in the bending region b in the present disclosure, that is, the taper angle λ of the second openings K2 is also greater than or equal to 160° and smaller than or equal to 170°, and correspondingly, the second angle of gradient θ of the pixel defining layer 103 is greater than or equal to 10° and smaller than or equal to 20°, which is not limited herein.

Figure 4:
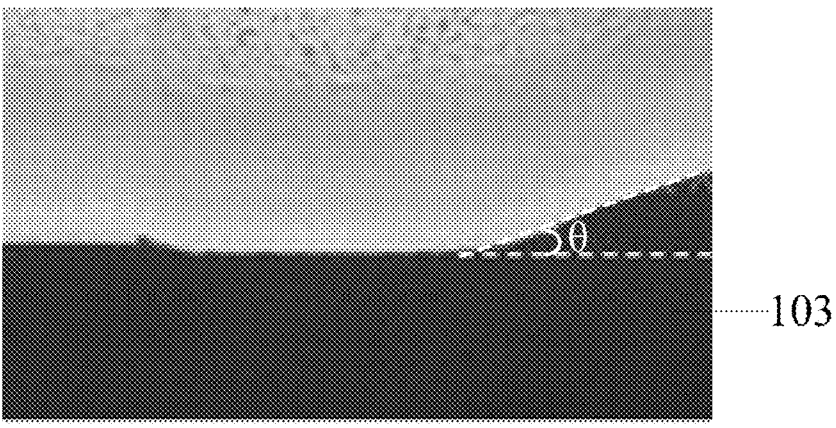
FIG. 4 is a micrograph of a side surface of a pixel defining layer in the related art.

It needs to be noted that in the present disclosure, under the condition that the second openings K2 in the flat region a keep the same shape as in the related art, as shown in FIG. 4, a side surface of the pixel defining layer 103 located in the flat region a is a plane, an included angle (namely, a second angle of gradient θ of the pixel defining layer 103 in the flat region a) between the plane and a side surface of the pixel defining layer 103 close to the base substrate 101 is greater than or equal to 30° and smaller than or equal to 40° (namely, supplementary with the taper angle λ of the second openings K2).

Generally, in the above display substrate provided by the embodiment of the present disclosure, each of the sub-pixels 102 includes an anode and a cathode, and a light-emitting function layer located between the anode and the cathode. The light-emitting function layer includes but is not limited to: a hole injection layer, a hole transport layer, an electron blocking layer, a light-emitting material layer, a hole blocking layer, an electron transport layer and an electron injection layer.

Based on the same inventive concept, an embodiment of the present disclosure further provides a manufacturing method for a display substrate. As a principle of the manufacturing method for solving technical problems is similar to a principle of the above display substrate for solving technical problems, implementation of the manufacturing method provided by the embodiment of the present disclosure may refer to implementation of the above display substrate provided by the embodiment of the present disclosure, and repetitions are omitted.

An embodiment of the present disclosure provides a manufacturing method for a display substrate, which may specifically include the following steps:

a base substrate is provided;

a pixel defining layer is formed on the base substrate, wherein the pixel defining layer has a plurality of first openings with a taper angle being greater than a preset angle in a to-be-bent region;

a plurality of sub-pixels are formed in the plurality of first openings of the pixel defining layer; and the base substrate having the plurality of sub-pixels are bent, wherein a curvature of the bending region is in positive correlation with the taper angle of the first openings, such that emergent light of the sub-pixels of the bending region is not blocked by the pixel defining layer.

Figure 5:
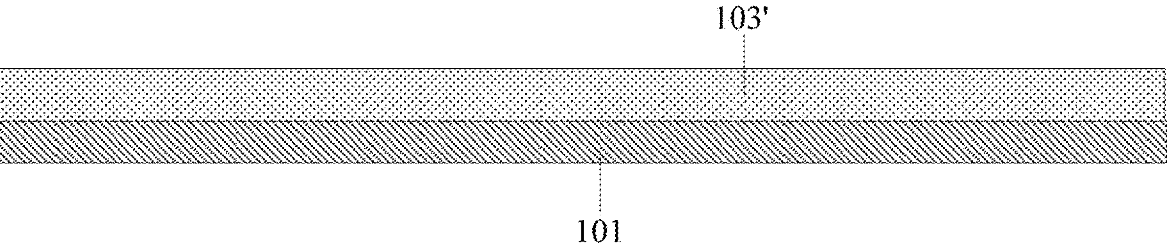
FIG. 5 is a schematic structural diagram of a display substrate in a manufacturing process provided by an embodiment of the present disclosure.
Figure 6:
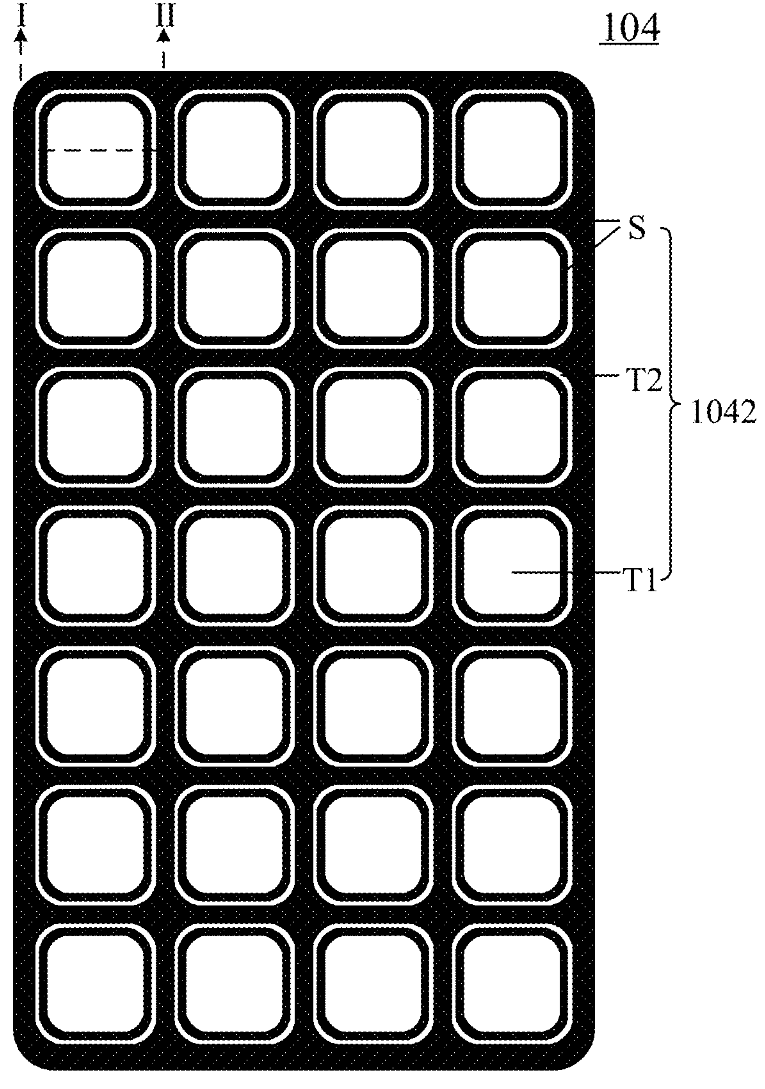
FIG. 6 is a schematic structural diagram of a first mask provided by an embodiment of the present disclosure.
Figure 7:
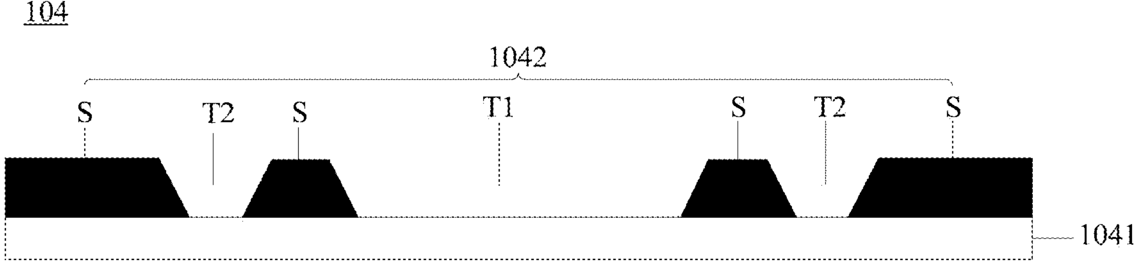
FIG. 7 is a schematic structural sectional view along a line I-II in FIG. 6.
Figures 8, 9:
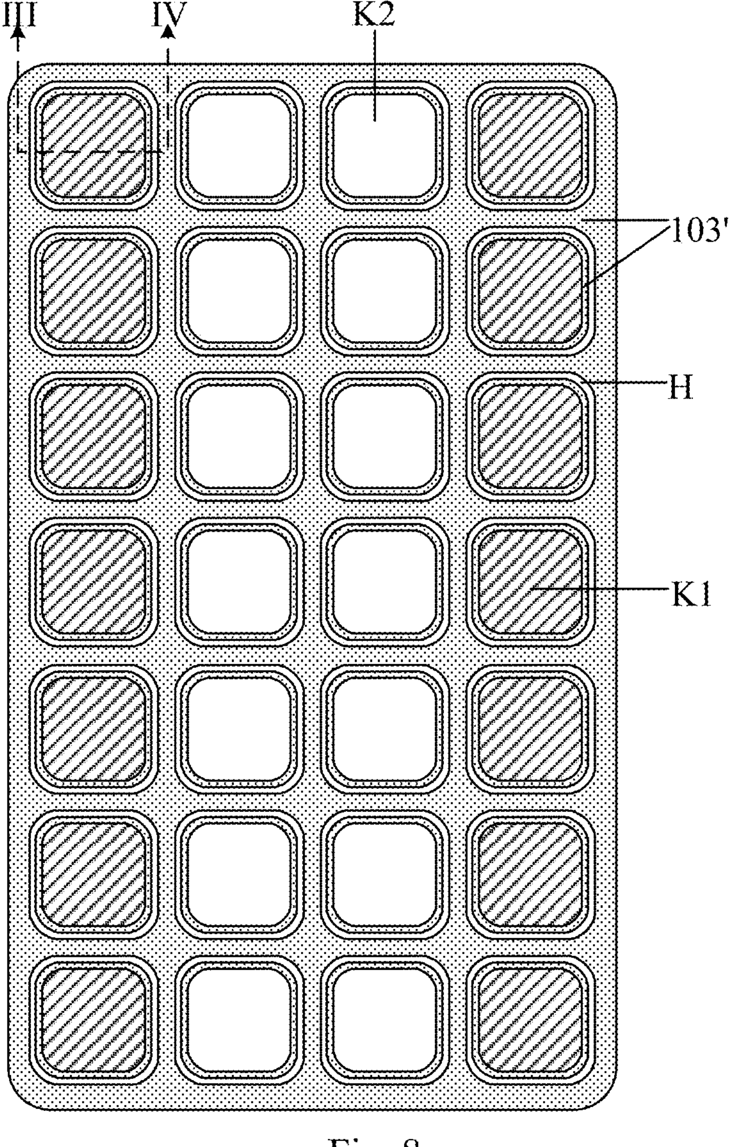
FIG. 8 is another schematic structural diagram of a display substrate in a manufacturing process provided by an embodiment of the present disclosure.
FIG. 9 is a schematic structural sectional view along a line III-IV in FIG. 8.
Figure 10:
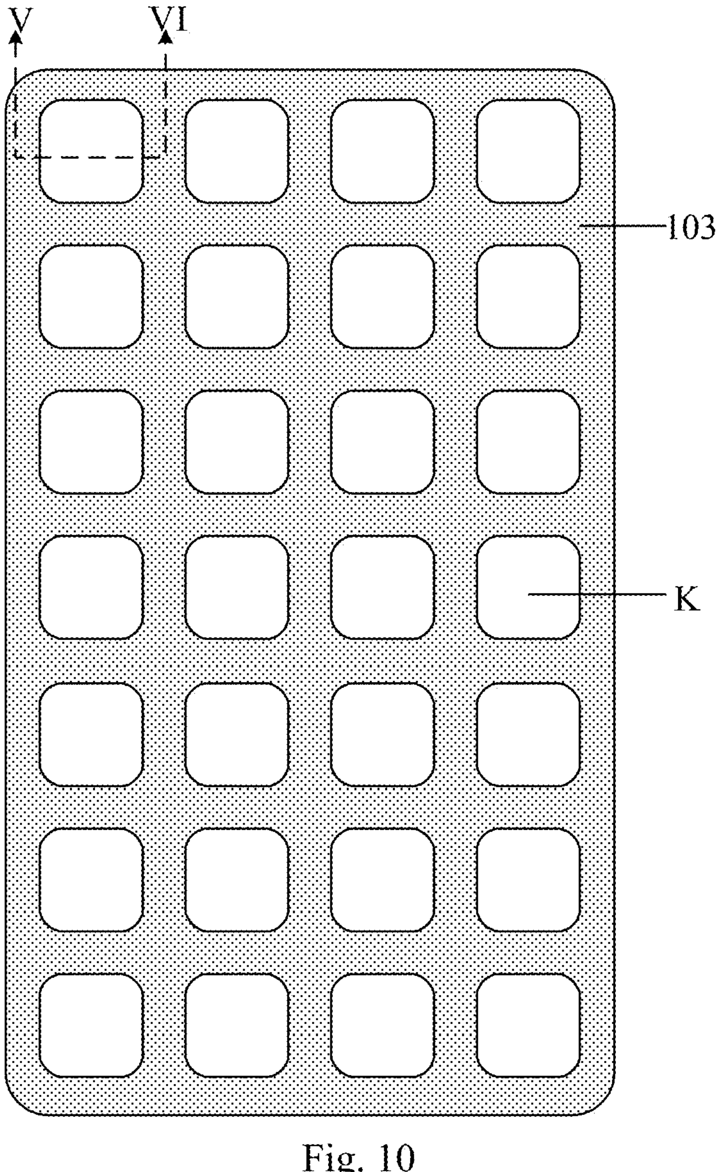
FIG. 10 is another schematic structural diagram of a display substrate in a manufacturing process provided by an embodiment of the present disclosure.
Figure 11:
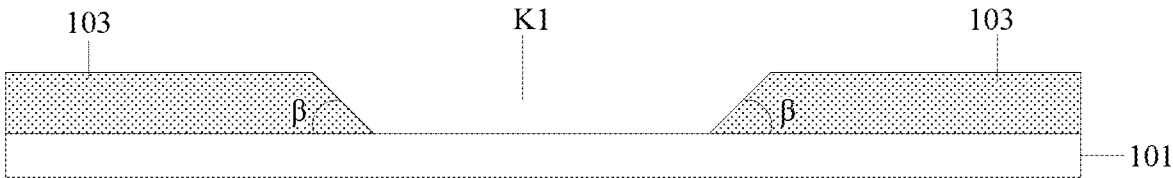
FIG. 11 is a schematic structural sectional view along a line V-VI in FIG. 10.

Optionally, in the above manufacturing method provided by the embodiment of the present disclosure, the forming a pixel defining layer may be implemented in the following mode:

a photosensitive material layer 103' is formed on the base substrate 101, as shown in FIG. 5;

a first mask 104 is provided, wherein the first mask 104 includes a first transparent substrate 1041 and a first light shield layer 1042 located on the first transparent substrate 1041, and the first light shield layer 1042 has a plurality of first light transmitting regions T1, a plurality of second light transmitting regions T2 surrounding the first light transmitting regions T1, and a light shield region S located between the first light transmitting regions T1 as well as a light shield region S located between the first light transmitting regions T1 and the second light transmitting regions T2, as shown in FIG. 6 and FIG. 7;

processing of exposure and developing is performed on the photosensitive material layer 103' in sequence by adopting the first mask 104, and in the photosensitive material layer 103', a plurality of first openings K1 located in a to-be-bent region, a plurality of second openings K2 located in a flat region a, and annular grooves H surrounding the first openings K1 and the second openings K2 are formed, as shown in FIG. 8 and FIG. 9, specifically, a width of each of the annular grooves H may be 0.5 μm to 5 μm (for example, 0.5 μm, 1 μm, 1.5 μm, 2 μm, 2.5 μm, 3 μm, 3.5 μm, 4 μm, 4.5 μm, 5 μm and the like), and a width of the photosensitive material layer 103' between the annular grooves H and the first openings K1 or the second openings K2 may be 0.5 μm to 5 μm (for example, 0.5 μm, 1 μm, 1.5 μm, 2 μm, 2.5 μm, 3 μm, 3.5 μm, 4 μm, 4.5 μm, 5 μm and the like); and baking processing is performed on the photosensitive material layer 103', in a process of baking processing, the annular grooves H may be filled with the photosensitive material layer 103' around the annular grooves due to fluidity of the photosensitive material layer 103', so that there is no annular groove H in the finally formed pixel defining layer 103, compared with a conventional design in the related art, a thickness of the pixel defining layer 103 surrounding the first openings K1 and the second openings K2 is reduced, a taper angle is reduced, and a pixel defining layer 103 with a taper angle being 10°-20° in the to-be-bent region and the flat region a are formed finally, as shown in FIG. 10 and FIG. 11. It is easy to understand that the annular grooves H may be filled with the photosensitive material layer 103' around the annular grooves in the process of baking processing, so the larger the width of each of the annular grooves H is, the thinner the finally formed pixel defining layer 103 becomes and the smaller the taper angle gets.

Figure 12:
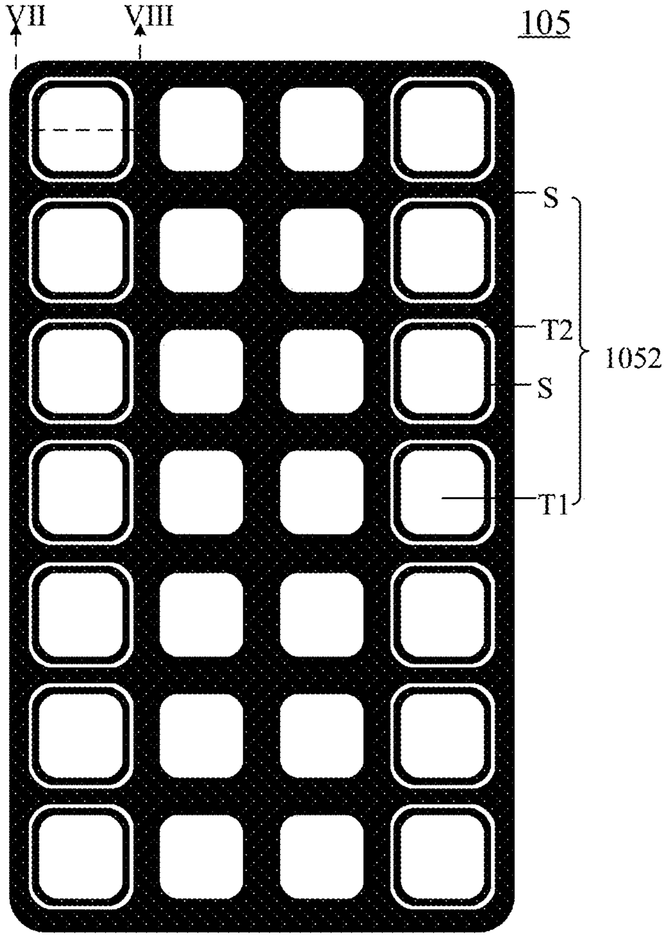
FIG. 12 is a schematic structural diagram of a second mask provided by an embodiment of the present disclosure.
Figure 13:
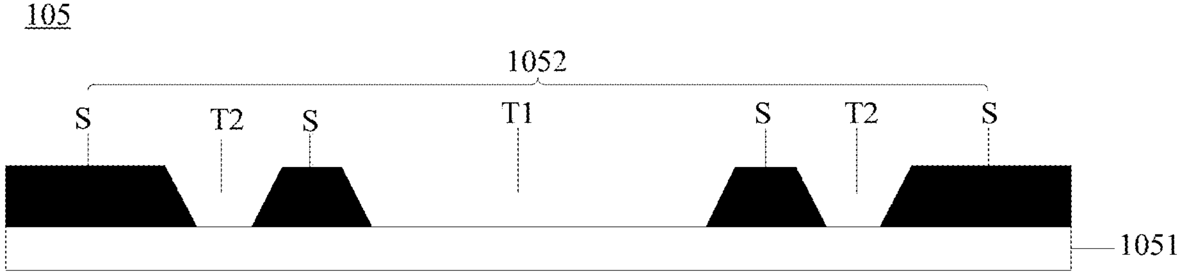
FIG. 13 is a schematic structural sectional view along a line VII-VIII in FIG. 12.
Figure 14:
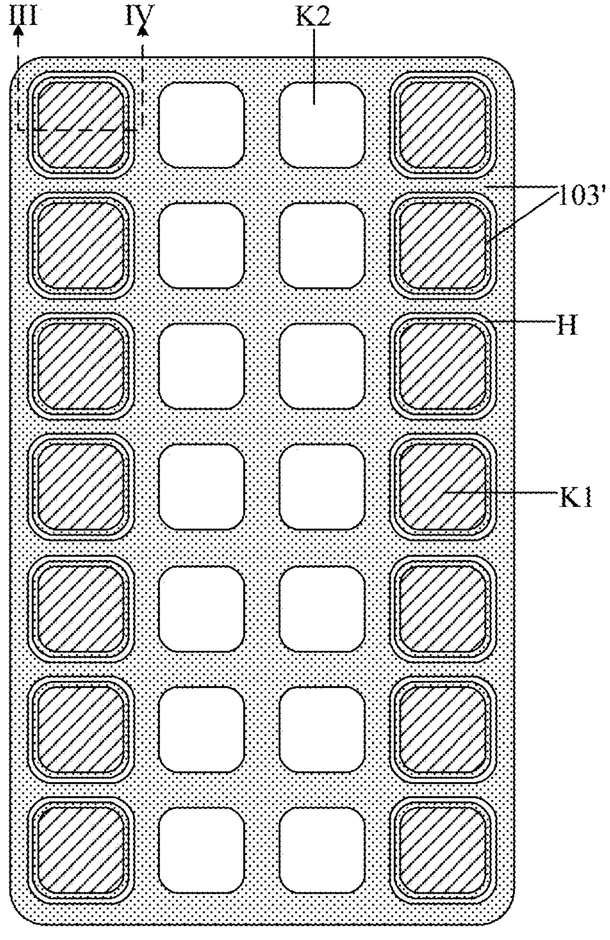
FIG. 14 is another schematic structural diagram of a display substrate in a manufacturing process provided by an embodiment of the present disclosure.

Optionally, in the above manufacturing method provided by the embodiment of the present disclosure, the forming a pixel defining layer may be further implemented specifically in the following mode:

a photosensitive material layer 103' is formed on the base substrate 101, as shown in FIG. 5;

a second mask 105 is provided, wherein the second mask 105 includes a second transparent substrate 1051, and a second light shield layer 1052 located on the second transparent substrate 1051, the second light shield layer 1052 corresponding to a to-be-bent region and a flat region a has a plurality of first light transmitting regions T1, and a light shield region S located between all the first light transmitting regions T1, and the light shield region S in the to-be-bent region further internally has a plurality of second light transmitting regions T2 surrounding the first light transmitting regions T1, as shown in FIG. 12 and FIG. 13;

processing of exposure and developing is performed on the photosensitive material layer 103' in sequence by adopting the second mask 105, and in the photosensitive material layer 103', a plurality of first openings K1 located in the to-be-bent region, a plurality of second openings K2 located in the flat region, and a plurality of annular grooves H surrounding the first openings K1 are formed, as shown in FIG. 14 and FIG. 9; and baking processing is performed on the photosensitive material layer 103', and a pixel defining layer 103 with a taper angle being 10°-20° in the to-be-bent region and a taper angle being 30°-40° in the flat region is formed.

Figure 15:
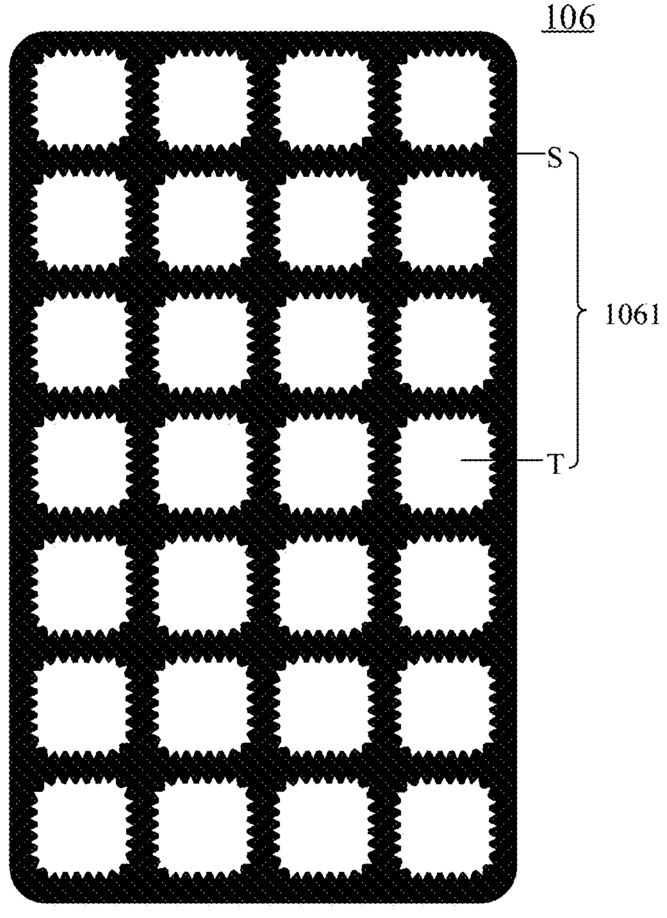
FIG. 15 is a schematic structural diagram of a third mask provided by an embodiment of the present disclosure.
Figure 16:
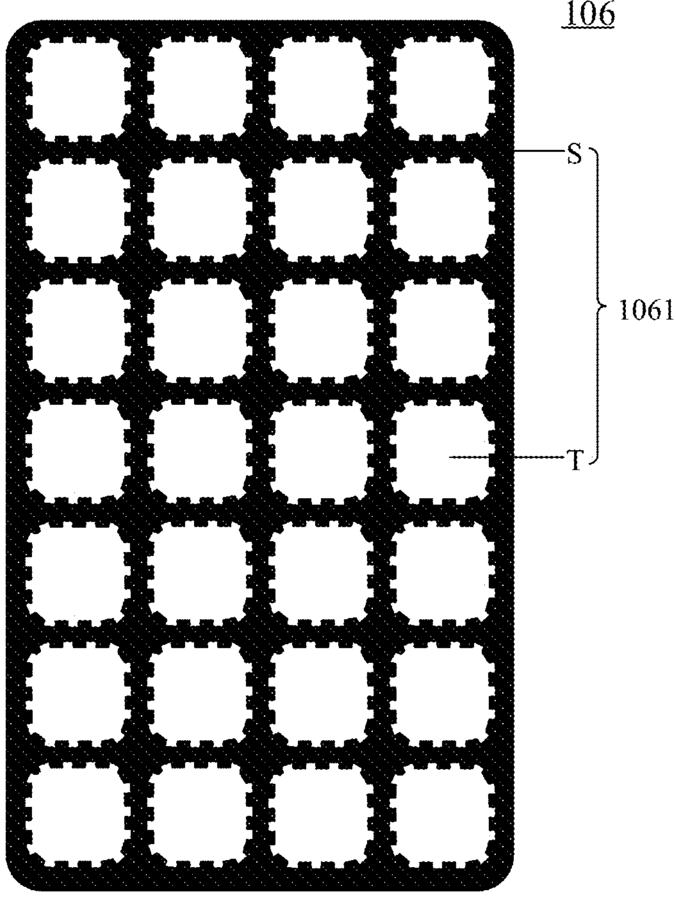
FIG. 16 is another schematic structural diagram of a third mask provided by an embodiment of the present disclosure.
Figure 17:
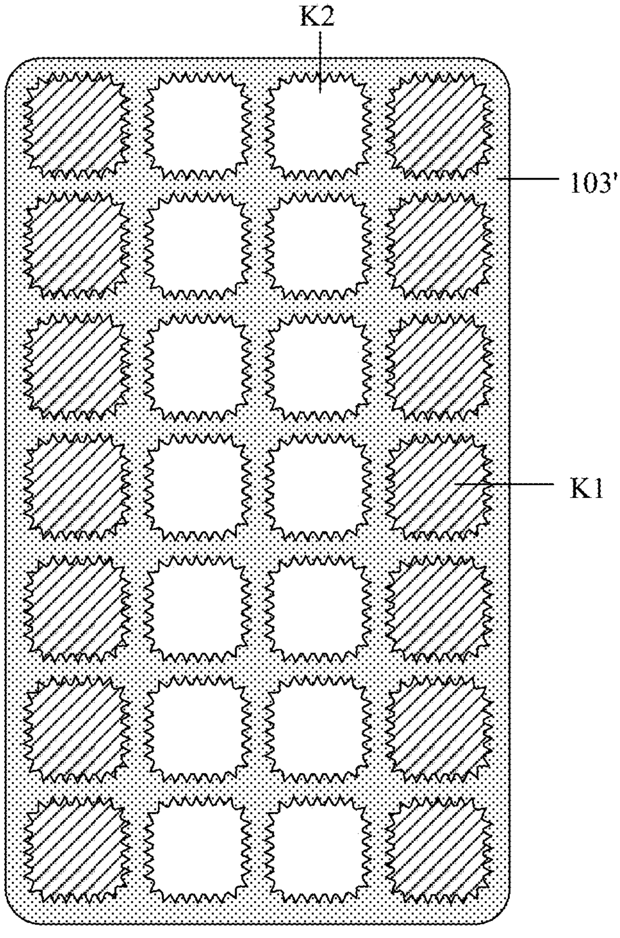
FIG. 17 is another schematic structural diagram of a display substrate in a manufacturing process provided by an embodiment of the present disclosure.
Figure 18:
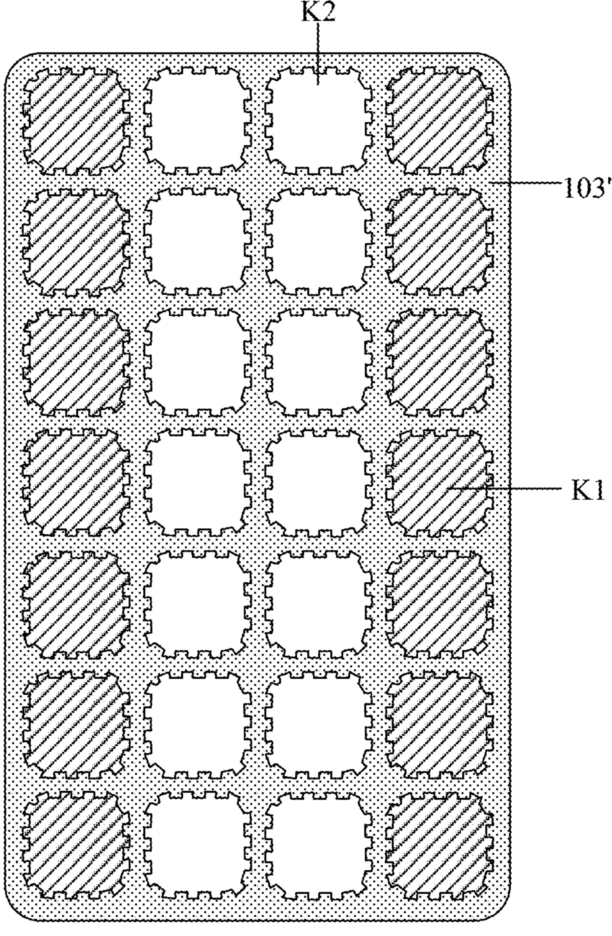
FIG. 18 is another schematic structural diagram of a display substrate in a manufacturing process provided by an embodiment of the present disclosure.

Optionally, in the above manufacturing method provided by the embodiment of the present disclosure, the forming a pixel defining layer may be further implemented through the following steps:

a photosensitive material layer 103' is formed on the base substrate 101, as shown in FIG. 5;

a third mask 106 is provided, wherein the third mask 106 includes a third light shield layer 1061, and the third light shield layer 1061 has a plurality of light transmitting regions T and a light shield region S which is located between all the light transmitting regions T and has a sawtooth structure at an edge, as shown in FIG. 15 and FIG. 16, specifically, FIG. 15 shows that the sawtooth structure is triangular, FIG. 16 shows that the sawtooth structure is rectangular, and during specific implementation, the sawtooth structure may also be in other shapes, which is not specifically limited herein;

processing of exposure and developing is performed on the photosensitive material layer 103' in sequence by adopting the third mask 106, and in the photosensitive material layer 103', a plurality of first openings K1 located in a to-be-bent region and a plurality of second openings K2 located in a flat region are formed, wherein the photosensitive material layer 103' around the plurality of first openings K1 and the plurality of second openings K2 has a sawtooth structure, as shown in FIG. 17 and FIG. 18; and baking processing is performed on the photosensitive material layer 103', the photosensitive material layer 103' around the sawtooth structure may fill a gap between the sawtooth structure in a process of baking processing due to fluidity of the photosensitive material layer 103', so that there is no sawtooth structure on the finally formed pixel defining layer 103, and compared with a conventional design in the related art, a thickness of the pixel defining layer 103 surrounding the first openings K1 and the second openings K2 is reduced and a taper angle is reduced, specifically, a pixel defining layer 103 with a taper angle being 10°-20° in the to-be-bent region and the flat region is formed.

Figure 19:
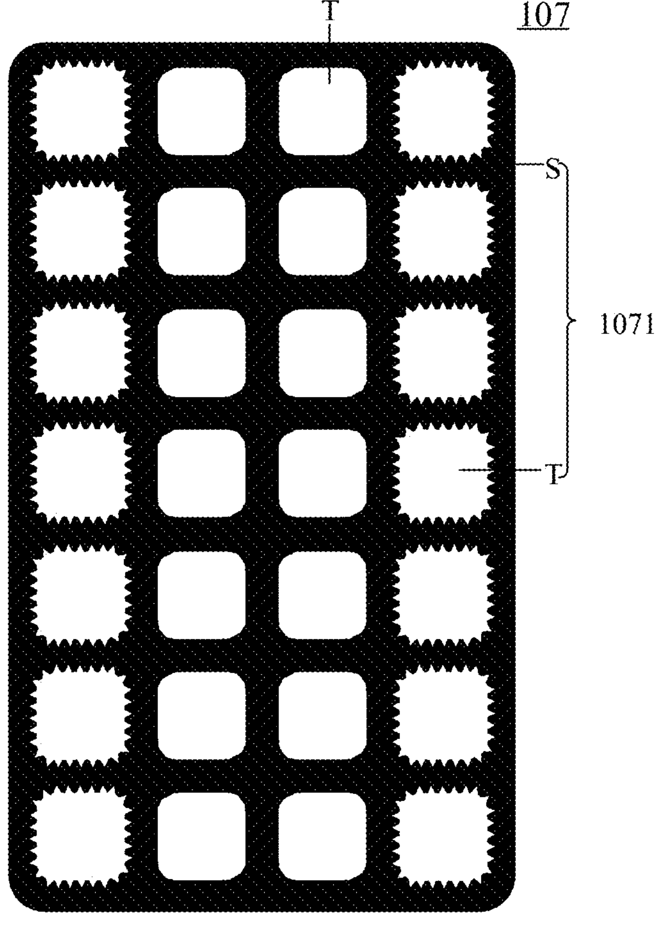
FIG. 19 is a schematic structural diagram of a fourth mask provided by an embodiment of the present disclosure.
Figure 20:
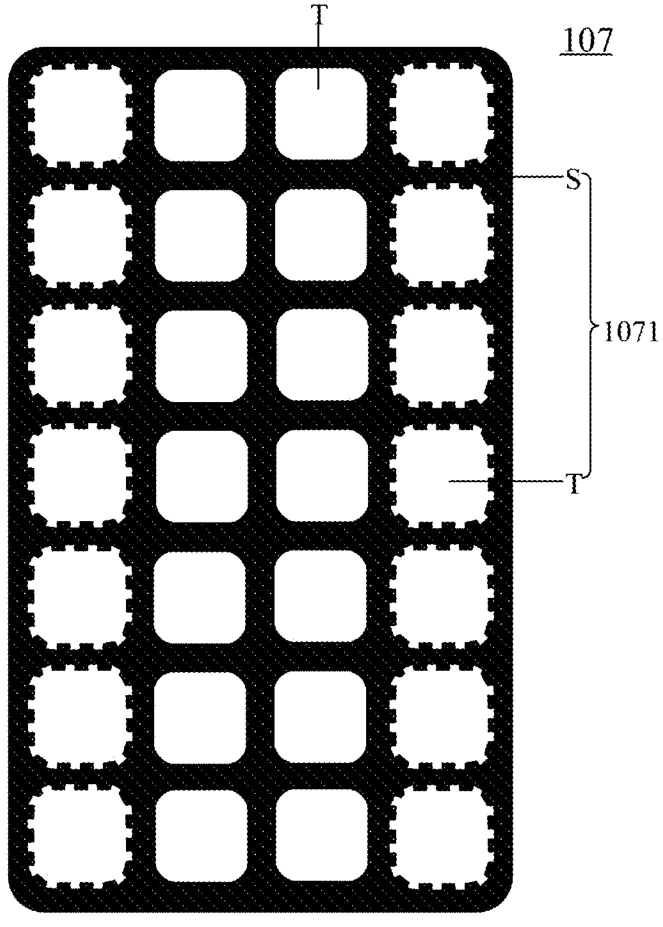
FIG. 20 is another schematic structural diagram of a fourth mask provided by an embodiment of the present disclosure.
Figure 21:
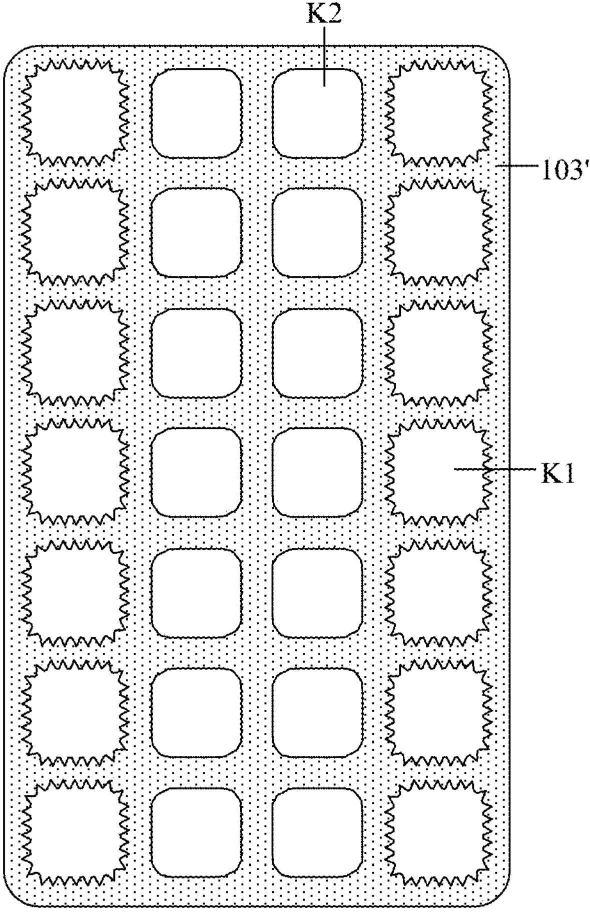
FIG. 21 is another schematic structural diagram of a display substrate in a manufacturing process provided by an embodiment of the present disclosure.
Figure 22:
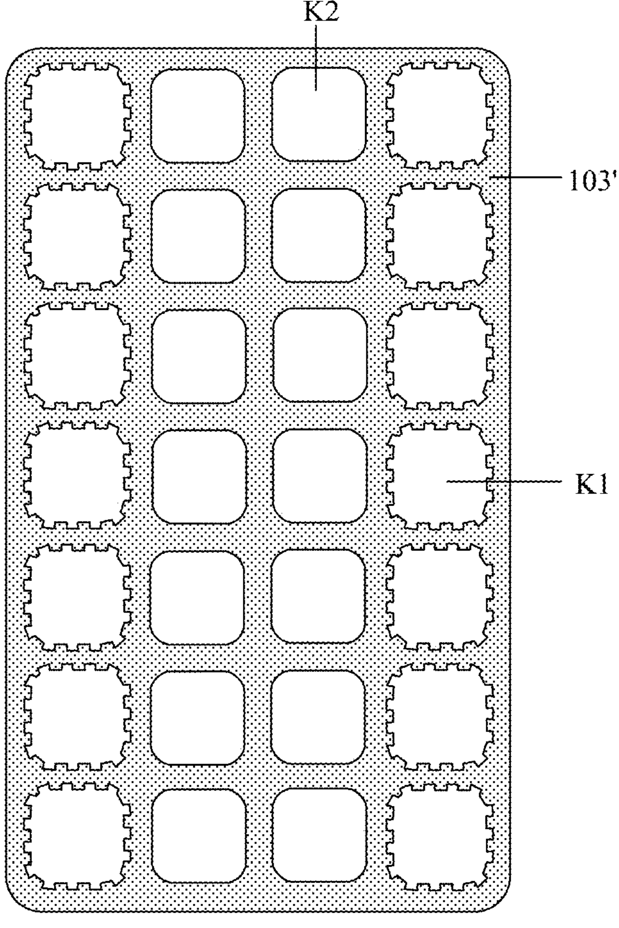
FIG. 22 is another schematic structural diagram of a display substrate in a manufacturing process provided by an embodiment of the present disclosure.

Optionally, in the above manufacturing method provided by the embodiment of the present disclosure, the forming a pixel defining layer may be further implemented specifically in the following mode:

a photosensitive material layer 103' is formed on the base substrate 101, as shown in FIG. 5;

a fourth mask 107 is provided, wherein the fourth mask 107 includes a fourth light shield layer 1071, the fourth light shield layer 1071 corresponding to the to-be-bent region and the flat region has a plurality of light transmitting regions T, and a light shield region S located between all the light transmitting regions T, and an edge of the light shield region S corresponding to the to-be-bent region has a sawtooth structure, as shown in FIG. 19 and FIG. 20;

processing of exposure and developing is performed on the photosensitive material layer 103' in sequence by adopting the fourth mask 107, and in the photosensitive material layer 103', a plurality of first openings K1 located in the to-be-bent region and a plurality of second openings K2 located in the flat region are formed, wherein the photosensitive material layer 103' around the plurality of first openings K1 has a sawtooth structure, as shown in FIG. 21 and FIG. 22; and baking processing is performed on the photosensitive material layer 103', and a pixel defining layer 103 with a taper angle being 10°-20° in the to-be-bent region and a taper angle being 30°-40° in the flat region is formed.

Based on the same inventive concept, an embodiment of the present disclosure provides a display panel, as shown in FIG. 1, including the above display substrate 01 provided by the embodiment of the present disclosure. The display panel is a large-angle bent AMOLED panel. Other necessary components (for example, a pixel circuit, a gate drive circuit, a source drive circuit, a light-emitting control drive circuit, an encapsulation layer and a protective cover plate 02) of the display panel should be understood by those ordinarily skilled in the art, which is not described in detail herein, nor serves as a limit on the present disclosure. Besides, a principle of the display panel for solving problems is similar to a principle of the above display substrate for solving problems, so implementation of the display panel provided by the embodiment of the present disclosure may refer to implementation of the above display substrate provided by the embodiment of the present disclosure, and repetitions are omitted.

Based on the same inventive concept, an embodiment of the present disclosure further provides a display apparatus, including the above display panel provided by the embodiment of the present disclosure. The display apparatus may be: a mobile phone, a tablet computer, a television, a display, a notebook computer, a digital photo frame, a navigator, a smartwatch, a fitness wristband, a personal digital assistant and any product or component with a display function. Other necessary components (for example, a chip on film and a drive circuit board) of the display apparatus should be understood by those ordinarily skilled in the art, which is not described in detail herein, nor serves as a limit on the present disclosure. Besides, a principle of the display apparatus for solving problems is similar to a principle of the above display panel for solving problems, so implementation of the display apparatus may refer to the embodiment of the above display panel, and repetitions are omitted.

The above display substrate, display panel and display apparatus provided by the embodiments of the present disclosure include: the base substrate, including the bending region; the plurality of sub-pixels, located on the base substrate; and the pixel defining layer, having the plurality of first openings in the bending region, wherein the orthographic projections of the plurality of sub-pixels in the bending region are located in the orthographic projections of the plurality of first openings, the taper angle of the first openings is greater than the preset angle, and the taper angle of the first openings is in positive correlation with the curvature of the bending region, such that the emergent light of the sub-pixels in the bending region is not blocked by the pixel defining layer. By improving the first openings of the bending region, the emergent light of the sub-pixels in the bending region is not blocked by the pixel defining layer, so that the blue light emitted by the sub-pixels is prevented from turning into yellow light due to being blocked and absorbed by the pixel defining layer, it is guaranteed that the blue light, the green light and the red light emitted by the sub-pixels are mixed to form white light, and thus improving the edge color shift.

Apparently, those skilled in the art can make various modifications and transformations for the embodiments of the present disclosure without departing from the spirit and scope of the embodiments of the present disclosure. In this case, if these modifications and transformations of the embodiments of the present disclosure fall within the scope of claims of the present disclosure and their equivalents, the present disclosure also intends to contain these modifications and transformations.

What is claimed is:

1. A display substrate, comprising:

a base substrate, comprising a bending region;

a plurality of sub-pixels, located on the base substrate; and a pixel defining layer, having a plurality of first openings in the bending region, wherein orthographic projections of the sub-pixels in the bending region are located in orthographic projections of the first openings, a taper angle of the first openings is greater than a preset angle, and the taper angle of the first openings is in positive correlation with a curvature of the bending region, such that emergent light of the sub-pixels in the bending region is not blocked by the pixel defining layer;

wherein in the bending region, a side surface of the pixel defining layer comprises: a first part, and a transition part and a second part, the transition part and the second part are arranged alternately to form a sawtooth structure at a boundary of a side of the first part close to the base substrate, wherein in a direction perpendicular to the base substrate, a thickness of the second part is greater than a thickness of the transition part and smaller than a thickness of the first part.

2. The display substrate according to claim 1, wherein the taper angle of the first openings is greater than or equal to 160° and smaller than or equal to 170°.

3. The display substrate according to claim 1, wherein the base substrate further comprises a flat region, the pixel defining layer has a plurality of second openings in the flat region, orthographic projections of the sub-pixels in the flat region are located in orthographic projections of the second openings, and a shape of the second openings is same as a shape of the first openings.

4. The display substrate according to claim 1, wherein the base substrate further comprises a flat region, the pixel defining layer has a plurality of second openings in the flat region, orthographic projections of the sub-pixels in the flat region are located in orthographic projections of the second openings, and a taper angle of the second openings is smaller than the taper angle of the first openings.

5. The display substrate according to claim 4, wherein the taper angle of the second openings is greater than or equal to 140° and smaller than or equal to 150°.

6. The display substrate according to claim 4, wherein in the flat region, a side surface of the pixel defining layer is a plane, and an included angle between the plane and a side surface of the pixel defining layer close to the base substrate is greater than or equal to 30° and smaller than or equal to 40°.

7. A display panel, comprising the display substrate according to claim 1.

8. A display apparatus, comprising the display panel according to claim 7.

* * * * *